United States Patent
Lee

(10) Patent No.: US 6,221,725 B1
(45) Date of Patent: Apr. 24, 2001

(54) METHOD OF FABRICATING SILICIDE LAYER ON GATE ELECTRODE

(75) Inventor: Claymens Lee, Fengshan (TW)

(73) Assignee: United Microelectronics, Corp., Hsinchu (TW)

( * ) Notice: Subject to any disclaimer, the term of this patent is extended or adjusted under 35 U.S.C. 154(b) by 0 days.

(21) Appl. No.: 09/286,004

(22) Filed: Apr. 5, 1999

(30) Foreign Application Priority Data

Feb. 8, 1999 (TW) .................................................. 88101872

(51) Int. Cl.$^7$ .................................................. H01L 21/336

(52) U.S. Cl. ........................... 438/304; 438/596; 438/655

(58) Field of Search ........................... 438/303, 304, 438/305, 306, 307, 592, 596, 655, 656, 664, 683

(56) References Cited

U.S. PATENT DOCUMENTS

| | | | |
|---|---|---|---|
| 4,716,131 | * 12/1987 | Okazawa et al. | 438/655 |
| 5,686,331 | * 11/1997 | Song | 438/304 |
| 6,046,105 | * 12/1987 | Kittl et al. | 438/655 |

* cited by examiner

*Primary Examiner*—Chandra Chaudhari
(74) *Attorney, Agent, or Firm*—Jiawei Huang; J. C. Patents

(57) ABSTRACT

A method of fabricating a silicide layer on a gate electrode is described. A gate oxide layer is formed on a substrate. A gate electrode is formed on a portion of the gate oxide layer. A spacer is formed on a sidewall of the gate electrode to cover the other portion of the gate oxide layer. The spacer is removed to expose a portion of the gate oxide layer. A metallic layer is formed over the substrate to cover the gate electrode and the gate oxide layer. An annealing step is performed to transform the metallic layer in contact with the gate electrode and the source/drain region into a silicide layer. The remaining metallic layer is removed.

13 Claims, 7 Drawing Sheets

METHOD OF FABRICATING SILICIDE LAYER ON GATE ELECTRODE

CROSS-REFERENCE TO RELATED APPLICATION

This application claims the priority benefit of Taiwan application serial no. 88101872, filed Feb. 8, 1999, the full disclosure of which is incorporated herein by reference.

BACKGROUND OF THE INVENTION

1. Field of the Invention

The present invention relates to a semiconductor fabricating method. More particularly, the present invention relates to a method of forming a silicide layer on a gate electrode.

2. Description of the Related Art

Silicide layers having reasonably low resistivities are generally used in integrated circuits. Typically, after forming a silicide layer, an annealing step is performed on the silicide layer. The silicide layer rearranges its crystal lattice during the annealing step. The resistivity of the silicide layer thus is further reduced. Therefore, by forming a silicide layer between the interconnections or between the gate and the source/drain region, the resistance between the interconnections or between a gate and a source/drain region can be decreased Reference is made to FIGS. 1A through 1I, which explain a conventional method of fabricating a silicide layer on a gate electrode.

In FIG. 1A, a shallow trench isolation structure 101 is formed in a semiconductor substrate 100. An active area 103 is next to the shallow trench isolation structure 101. A gate oxide layer 102 and a polysilicon layer 104 are formed in sequence over the semiconductor substrate 100 in the active area 103.

In FIG. 1B, the polysilicon layer 104 is patterned to leave a gate electrode 104a on the gate oxide layer 102.

In FIG. 1C, ion implantation is performed on the substrate 100 with the gate electrode 104a serving as a mask. A lightly doped drain region 106 is formed on opposite sides of the gate electrode 104a in the substrate 100.

In FIG. 1D, a buffer oxide layer 108 is formed over the substrate 100. A silicon nitride ($Si_3N_4$) layer 110 is formed on the buffer oxide layer 108.

In FIG. 1E, a portion of the silicon nitride layer 10 and a buffer oxide layer 108 are etched back to form a spacer 110a. The spacer 110a is formed on a sidewall of the gate electrode 104a over the buffer oxide layer 108.

In FIG. 1F, ion implantation is performed with the spacer 110a and the gate electrode 104a serving as masks. A source/drain region 112 is formed on opposite sides of the spacer 110a in the substrate 100.

In FIG. 1G, a potion of the gate oxide layer 102, which is on the source/drain region 112, exposed by the gate electrode 104a and the spacer 110a is removed by wet etching. A metallic layer 113 is formed over the substrate 100 to cover the gate electrode 104a and the spacer 110a.

In FIG. 1H, a thermal step is performed. The metallic layer 113 in contact with the gate electrode 104a and the source/drain region 112 are transformed into a silicide layer 114.

In FIG. 1I, the remaining metallic layer 113, which does not react during the thermal step, is removed.

However as seen in the above description, the silicide layer 114 is formed only on the top surface of the gate electrode 104a. The gate resistance that the silicide layer 114 can decrease is limited. Thus, the gate has a high resistance, which reduces the performance speed of devices.

SUMMARY OF THE INVENTION

The invention provides a method of fabricating a silicide layer on a gate electrode. A gate oxide layer is formed on a substrate. A gate electrode is formed on a portion of the gate oxide layer. A spacer is formed on a sidewall of the gate electrode to cover a portion of the gate oxide layer. The spacer is removed to expose a portion of the gate oxide layer. A metallic layer is formed over the substrate to cover the gate electrode and the gate oxide layer. An annealing step is performed to transform the metallic layer in contact with the gate electrode and the source/drain region into a silicide layer. The remaining metallic layer is removed.

The present invention forms the silicide layer not only on the top surface of the gate electrode but also on the sidewall of the gate electrode. In comparison with the conventional method, which only forms a silicide layer on the top surface of the gate electrode, the invention increases the formation of the silicide layer. Thus, the gate resistance is further reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
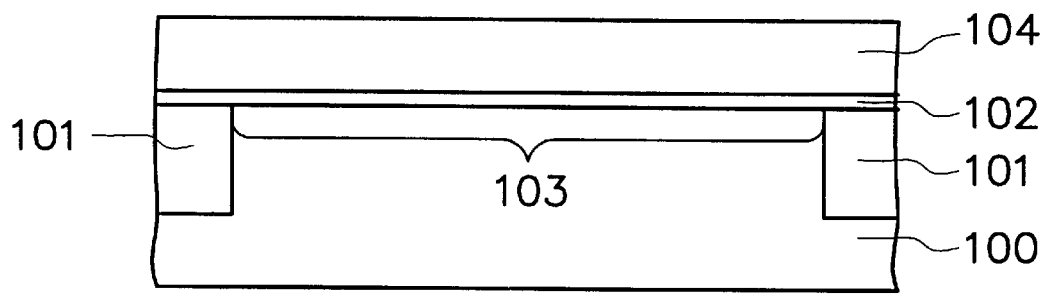
FIGS. 1A through 1I are schematic, cross-sectional views showing a conventional method of fabricating a silicide layer on a gate electrode.
Figure 1B:
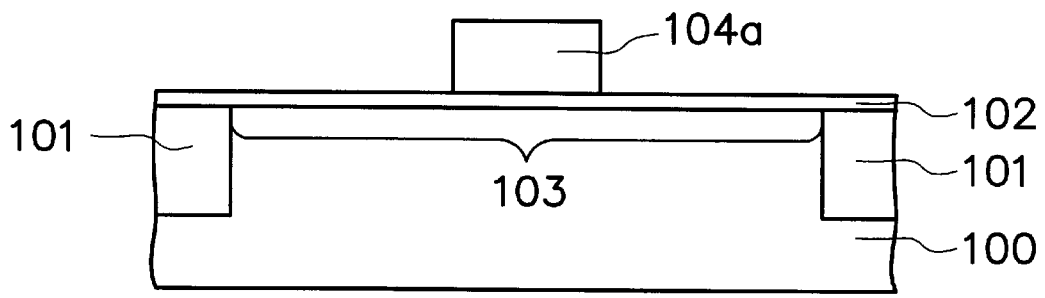
Figure 1C:
Figure 1C:
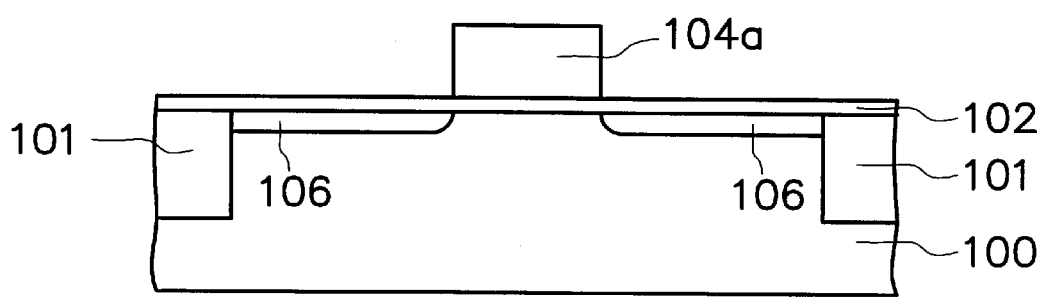
Figure 1D:
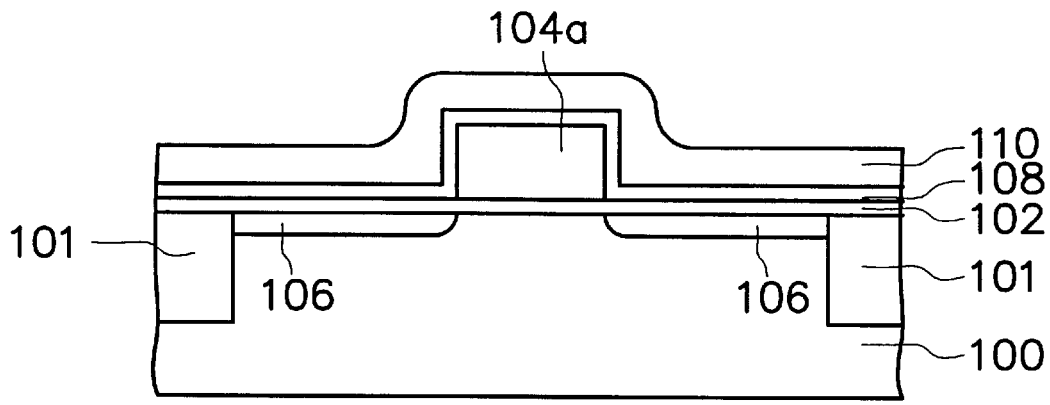
Figure 1E:
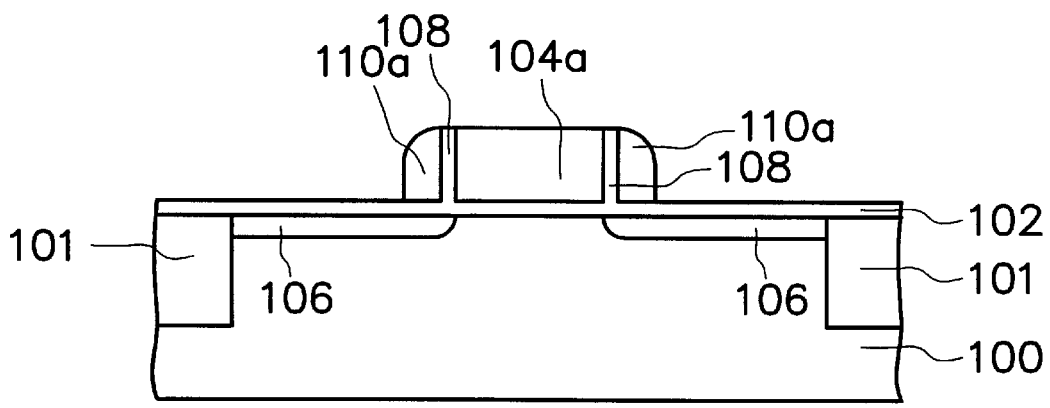
Figure 1F:
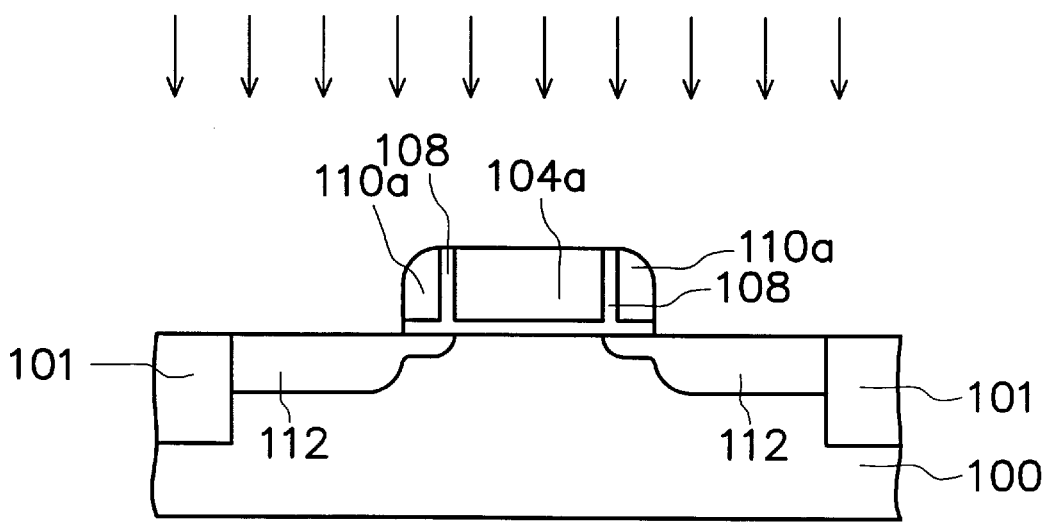
Figure 1G:
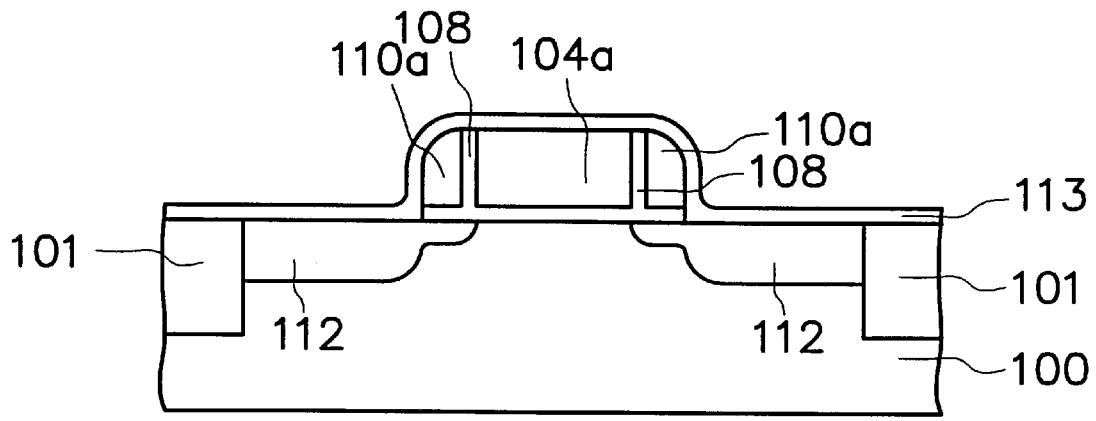
Figure 1H:
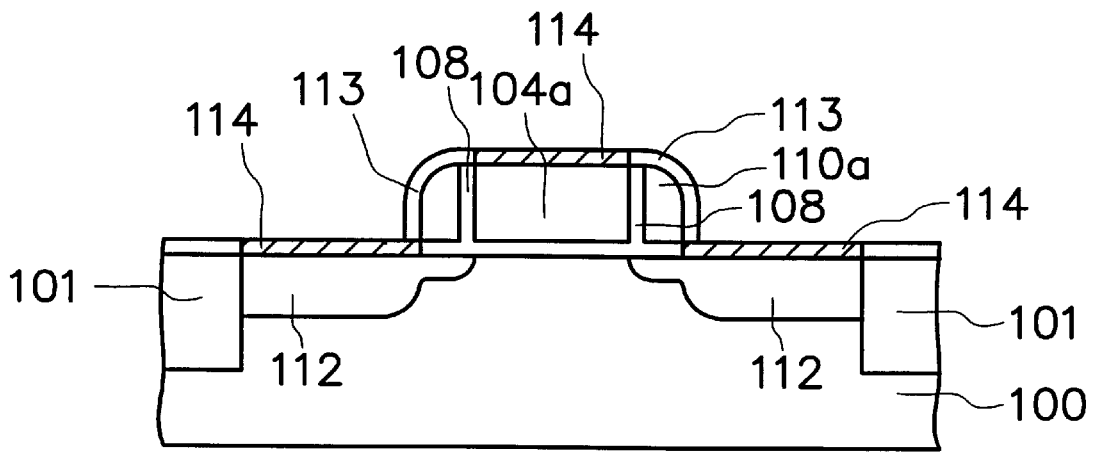

Reference will now be made in detail to the present preferred embodiments of the invention, examples of which are illustrated in the accompanying drawings. Wherever possible, the same reference numbers are used in the drawings and the description to refer to the same or like parts.

Reference is made to FIGS. 2A through 2J, which explain a method of fabricating a metal oxide semiconductor (MOS) transistor.

Figure 2A:
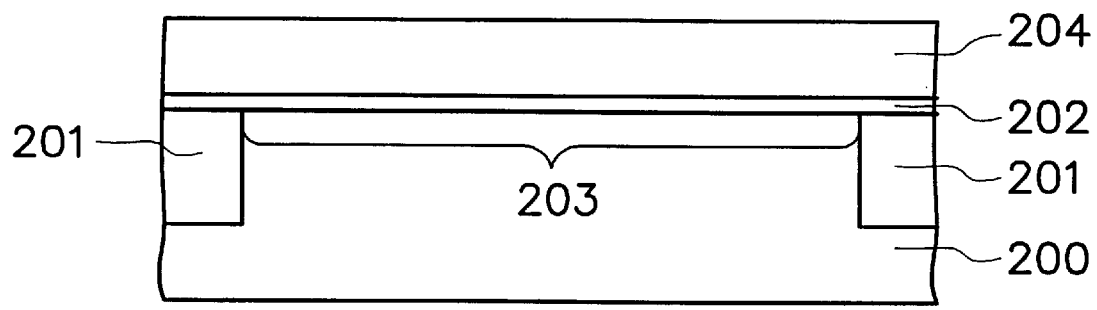
FIGS. 2A through 2J are schematic, cross-sectional views showing a method of fabricating a silicide layer on a gate electrode according to one preferred embodiment of the invention.

In FIG. 2A, an isolation layer 201, such as a shallow trench isolation structure, is formed in a substrate 200. An active region 203 is formed next to the isolation layer 201. A gate oxide layer 202 and a conductive layer 204 are formed in sequence over the substrate 200 in the active region 203. The material of the conductive layer 204 comprises polysilicon. The conductive layer 204 is formed by, for example, chemical vapor deposition.

Figure 2B:
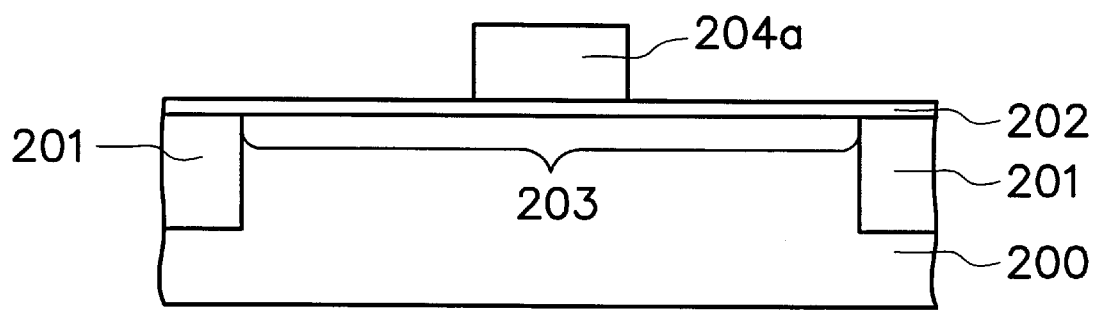

In FIG. 2B, the conductive layer 204 is patterned to form a gate electrode 204a on the substrate 200.

Figure 2C:
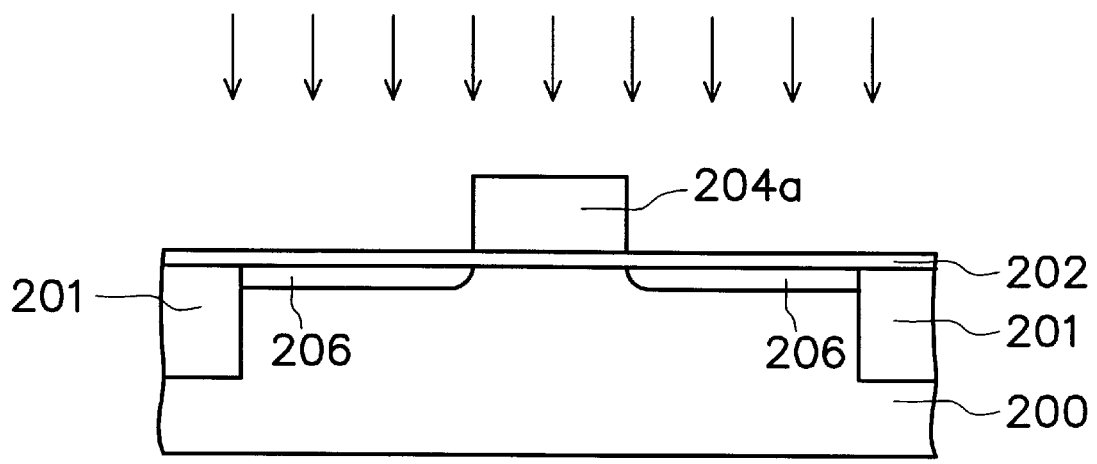

In FIG. 2C, ion implantation is performed with the gate electrode 204a serving as a mask with a preferred dosage of about $10^{13}$ ions/cm$^2$. A lightly doped drain region 206 is formed on opposite sides of the gate electrode 204a in the substrate 200. The implanted ions can be N-type ions, such as phosphorus (P) ions.

Figure 2D:
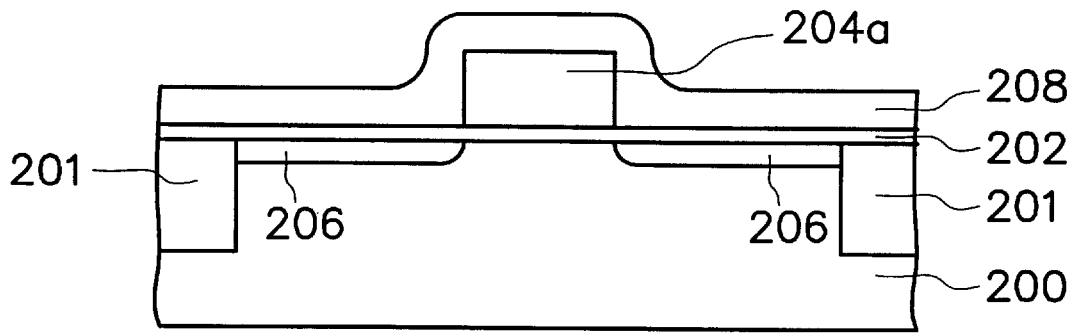

In FIG. 2D, an isolation layer 208, such as a silicon nitride layer, is formed over the substrate 200 to cover the gate electrode 204a. The isolation layer 208 can be formed by, for example, low-pressure chemical vapor deposition (LPCVD) or plasma-enhanced chemical vapor deposition (PECVD).

Figure 2E:
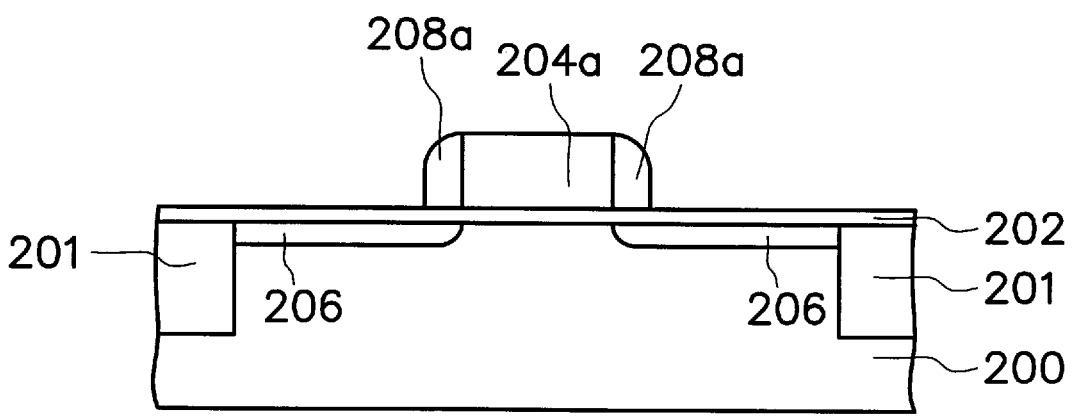

In FIG. 2E, a portion of the isolation layer 208 is etched back by, for example, anisotropic etching. A spacer 208a, which remains from the isolation layer 208, is formed on a sidewall of the gate electrode 204a.

Figure 2F:
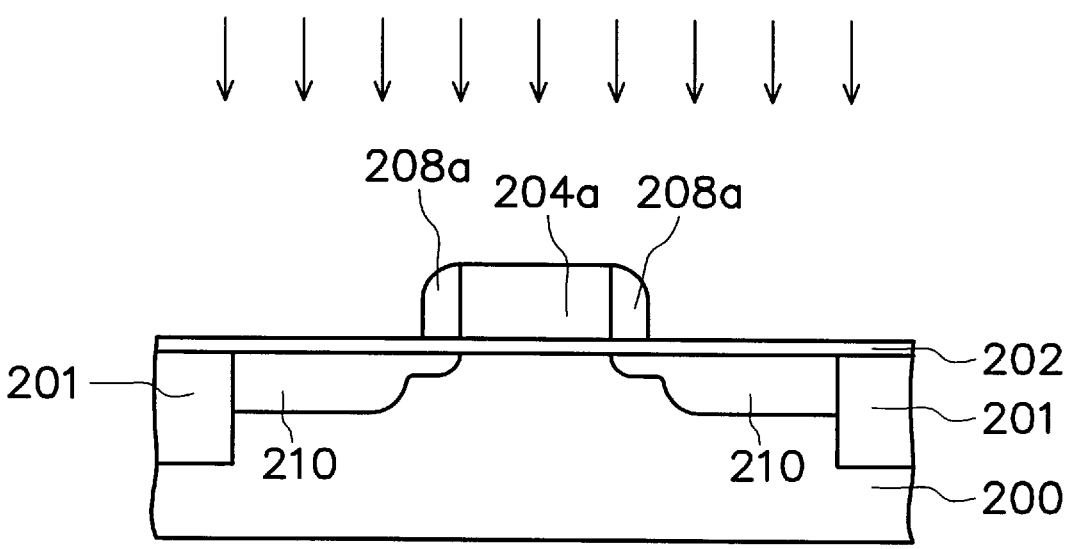

In FIG. 2F, ion implantation is performed with the spacer 208a and the gate electrode 204a serving as masks. A source/drain region 210 is formed on opposite sides of the spacer 204a in the substrate 200. For example, N-type ions, such as arsenic (As) ions, are implanted with a preferred dosage of about $10^{15}$ ions/cm$^2$. An annealing step is performed on the source/drain region 210.

Figure 2G:
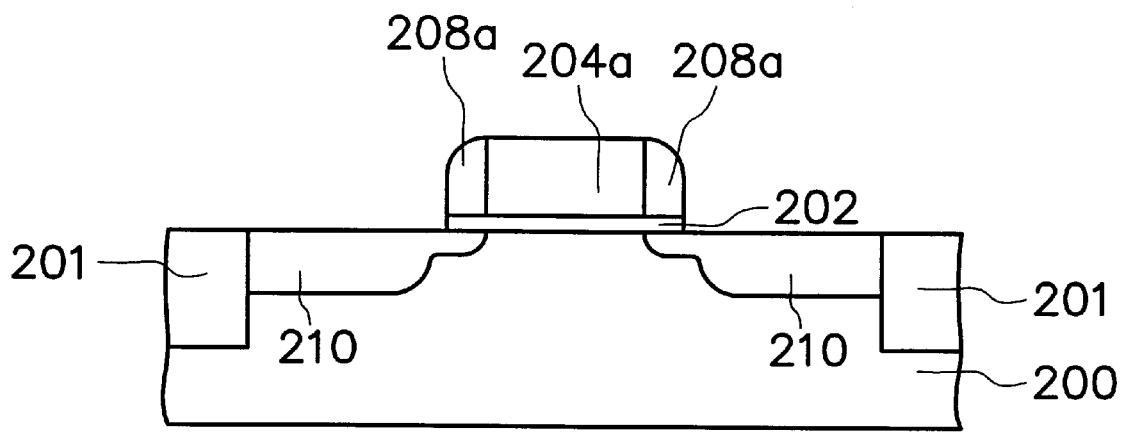

In FIG. 2G, a portion of the gate oxide layer 202 exposed by the gate electrode 204a and the spacer 208a on the source/drain region is removed by, for example, wet etching.

Figure 2H:
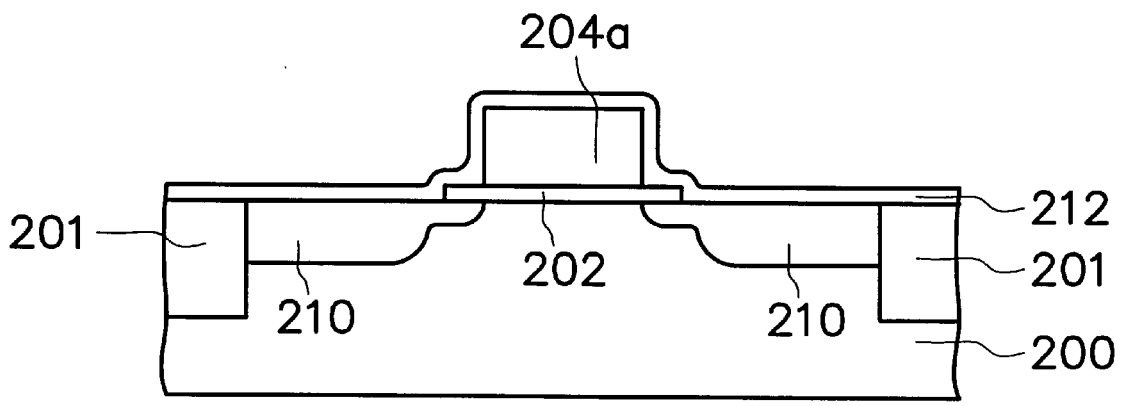

In FIG. 2H, the spacer 208a is removed by, for example, wet etching. A portion of the gate oxide layer 202, which was originally covered by the spacer 208a, is exposed. The sidewall of the gate electrode 204a is exposed. A metallic layer 212 is formed over the substrate 200 to cover the gate electrode 204a and the gate oxide layer 202. The material of the metallic layer 212 can be, for example, titanium (Ti), platinum (Pt), cobalt (Co), or tungsten (W). The metallic layer 212 can be formed by, for example, sputtering.

Figure 1I:
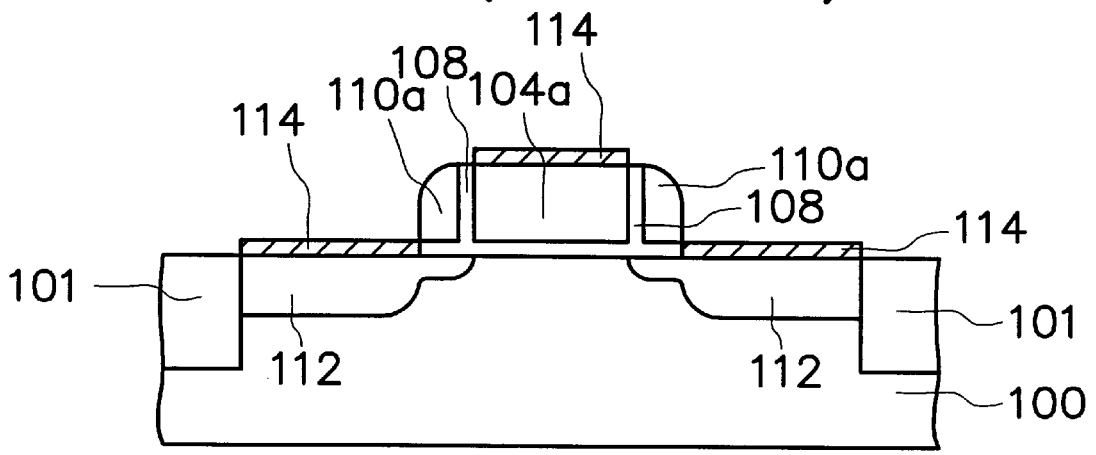
Figure 2I:
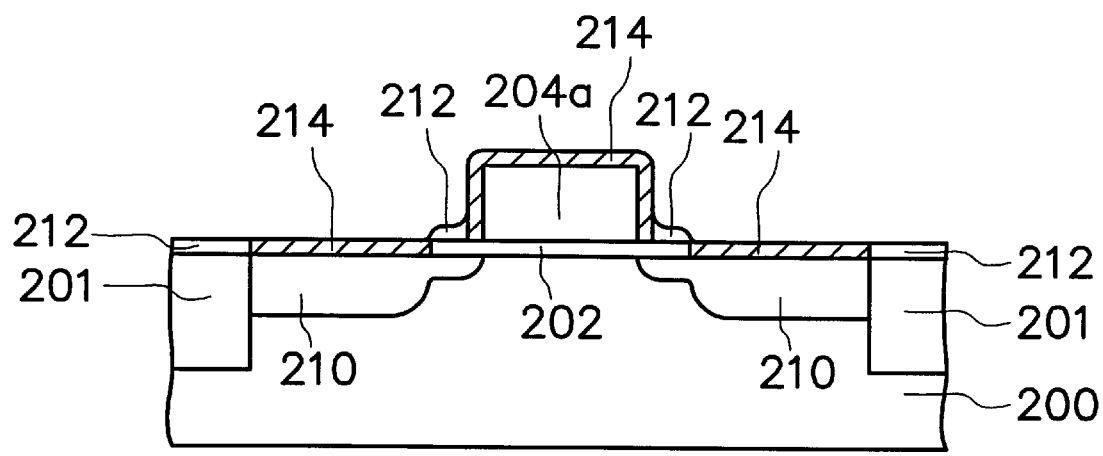

FIG. 2I, a thermal step is performed at a preferred temperature of about 750° C. The metallic layer 212 in contact with the gate electrode 204a and the source/drain region 210 is transformed into a silicide layer 214. The silicide layer 214 is formed on a top surface of the gate electrode 204a and the sidewall of the gate electrode 204a. In a case where the metallic layer 212 is titanium, the material of the silicide layer 214 is titanium silicide (TiSi$_2$). The present invention forms the silicide layer 214 not only on the top surface of the gate electrode 204 but also on the sidewall of the gate electrode 214a. In comparison with the conventional method, which only forms the silicide layer 114 (shown in FIG. 1I) on the top surface of the gate electrode 104a (shown in FIG. 1I), the invention increases the formation of the silicide layer 214. Thus, the gate resistance is reduced to one third of the gate resistance in the conventional method.

Figure 2J:
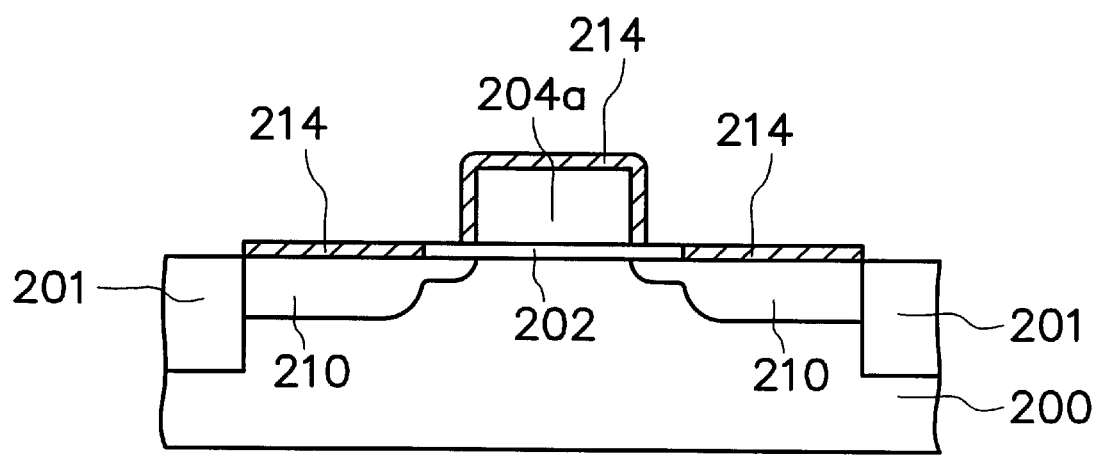

In FIG. 2J, the remaining metallic layer 212 is removed by, for example, wet etching. A rapid thermal process (RTP) is performed at a temperature of about 850° C.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a silicide layer on a gate, electrode, comprising the steps of:

forming a gate oxide layer on a substrate;

forming a gate electrode on a first portion of the gate oxide layer;

forming a spacer on a sidewall of the gate electrode to cover a second portion of the gate oxide layer;

removing the exposed portion of gate oxide layer;

removing the spacer to expose the second portion of the gate oxide layer;

after removing the spacer to expose the second portion of the gate oxide layer, forming a metallic layer over the substrate to cover a top surface and the sidewall of the gate electrode and the exposed gate oxide layer;

performing an annealing step to transform the metallic layer in contact with the gate electrode and the source/drain region into a silicide layer; and removing the remaining metallic layer.

2. The method of claim 1, wherein a material of the gate electrode comprises polysilicon.

3. The method of claim 1, wherein a material of the metallic layer comprises titanium.

4. The method of claim 1, wherein the step of forming the metallic layer comprises sputtering.

5. The method of claim 1, wherein the step of removing the remaining metallic layer comprises wet etching.

6. A method of metal oxide semiconductor transistor, comprising the steps of:

forming a gate oxide layer on a substrate;

forming a gate electrode on a first portion of the gate oxide layer;

forming a lightly doped drain region on opposite sides of the gate electrode in the substrate;

forming a spacer on a sidewall of the gate electrode to cover a second portion of the gate oxide layer;

forming a source/drain region on the opposite sides of the spacer in the substrate;

removing the exposed portion of gate oxide layer;

removing the spacer to expose the second portion of the gate oxide layer;

after removing the spacer to expose the second portion of the gate oxide layer, forming a metallic layer over the substrate to cover a top surface and the sidewall of the gate electrode and the exposed gate oxide layer;

performing an annealing step to transform the metallic layer in contact with the gate electrode and the source/drain region into a silicide layer; and removing the remaining metallic layer.

7. The method of claim 6, wherein a material of the gate electrode comprises polysilicon.

8. The method of claim 6, wherein a material of the metallic layer comprises titanium.

9. The method of claim 6, wherein the step of forming the metallic layer comprises sputtering.

10. The method of claim 6, wherein the step of removing the remaining metallic layer comprises wet etching.

11. The method of claim 6, further comprising an annealing step after removing the remaining metallic layer.

12. The method of claim 11, wherein the annealing step is performed at a temperature of about 850° C.

13. The method of claim 6, wherein the thermal step is performed at a temperature of about 750° C.

* * * * *